(12) United States Patent
Coakley et al.

(10) Patent No.: US 8,432,072 B2
(45) Date of Patent: Apr. 30, 2013

(54) THREE AXIS LINEAR ACTUATOR

(75) Inventors: Scott Coakley, Belmont, CA (US); Michael B. Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 872 days.

(21) Appl. No.: 12/424,878

(22) Filed: Apr. 16, 2009

(65) Prior Publication Data
US 2009/0263747 A1    Oct. 22, 2009

Related U.S. Application Data

(60) Provisional application No. 61/045,903, filed on Apr. 17, 2008.

(51) Int. Cl.
*H02K 41/03* (2006.01)
*G03B 27/58* (2006.01)
*G03F 7/20* (2006.01)

(52) U.S. Cl.
USPC .......................... 310/12.06; 335/53; 335/72

(58) Field of Classification Search ............... 310/12.06; 318/135; 335/72, 53; 355/53, 72
See application file for complete search history.

(56) References Cited

U.S. PATENT DOCUMENTS

| | | | |
|---|---|---|---|
| 6,097,114 A * | 8/2000 | Hazelton | 310/12.06 |
| 6,140,734 A | 10/2000 | Hazelton et al. | |
| 6,208,045 B1 * | 3/2001 | Hazelton et al. | 310/12.06 |
| 6,252,314 B1 | 6/2001 | Ebinuma | |
| 6,278,203 B1 | 8/2001 | Novak et al. | |
| 6,355,993 B1 | 3/2002 | Hazelton et al. | |
| 6,373,153 B1 | 4/2002 | Hazelton | |
| 6,445,093 B1 * | 9/2002 | Binnard | 310/12.06 |
| 6,570,273 B2 | 5/2003 | Hazelton | |
| 6,650,079 B2 * | 11/2003 | Binnard | 318/649 |
| 6,841,956 B2 | 1/2005 | Hazelton et al. | |
| 6,864,601 B2 * | 3/2005 | Sogard | 310/12.25 |
| 2004/0263000 A1 * | 12/2004 | Vreugdewater et al. | 310/12 |
| 2005/0030503 A1 * | 2/2005 | De Weerdt | 355/53 |

(Continued)

FOREIGN PATENT DOCUMENTS

| | | |
|---|---|---|
| JP | 405219717 A | 8/1993 |
| JP | 405344705 A | 12/1993 |

(Continued)

*Primary Examiner* — Tran Nguyen
(74) *Attorney, Agent, or Firm* — Roeder & Broder LLP

(57) ABSTRACT

A mover (344) moving a stage (238) along a first axis, along a second axis and along a third axis includes a magnetic component (354), a conductor component (356), and a control system (324). The magnetic component (354) includes a plurality of magnets (354D) that are surrounded by a magnetic field. The conductor component (356) is positioned near the magnetic component (354) in the magnetic field. Further, the conductor component (356) interacts with the magnetic component (354) when current is directed to the conductor component (356) to generate a controllable force along the first axis, a controllable force along the second axis, and a controllable force along the third axis. The conductor component (356) can include a split coil design, having a first conductor array (356A) and a second conductor array (356B) that is positioned substantially adjacent to the first conductor array (356A). The conductor component (356) and the magnetic component (354) can be displaced relative to each other along the third axis. The control system (324) independently directs current to each of the conductor arrays (356A, 356B) to generate a controllable force along the first axis, along the second axis, and along the third axis. With this design, the same mover can be used to move the stage along three degrees of freedom ("DOF").

30 Claims, 8 Drawing Sheets

U.S. PATENT DOCUMENTS

| | | | |
|---|---|---|---|
| 2006/0049697 A1* | 3/2006 | Binnard | 310/12 |
| 2006/0221323 A1 | 10/2006 | Cox et al. | |
| 2006/0232142 A1* | 10/2006 | Binnard | 310/12 |
| 2008/0252151 A1 | 10/2008 | Binnard et al. | |
| 2009/0263747 A1* | 10/2009 | Coakley et al. | 430/311 |

FOREIGN PATENT DOCUMENTS

| | | |
|---|---|---|
| JP | 2004-187401 A | 7/2004 |
| WO | 2008130560 A1 | 10/2008 |
| WO | WO2008/130560 A1 | 10/2008 |

\* cited by examiner

THREE AXIS LINEAR ACTUATOR

RELATED APPLICATION

This application claims priority on U.S. Provisional Application Ser. No. 61/045,903 filed on Apr. 17, 2008 and entitled "THREE AXIS X-Y-Z LINEAR ACTUATOR". As far as is permitted, the contents of U.S. Provisional Application Ser. No. 61/045,903 are incorporated herein by reference.

BACKGROUND

Exposure apparatuses for semiconductor processing are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, a measurement system, and a control system. For many exposure apparatuses, space is often at a premium. Thus, it is often desirable to make many of the components of the exposure apparatus as compact and efficient as possible.

One type of stage assembly includes a stage base, a stage that retains the wafer or reticle, and one or more movers that move the stage and the wafer or the reticle. One type of mover is a linear motor that moves the stage along a single axis. Because, it is often necessary to move the stage along more than one axis, multiple linear motors are typically required to move the stage with more than one degree of freedom. These multiple linear motors can complicate the design of the stage assembly and occupy a significant amount of space in the exposure apparatus.

A common three phase linear motor includes a pair of spaced apart magnet arrays that are surrounded by a magnetic field and a conductor array positioned between the magnet arrays. A three phase electrical current is directed to the conductor array. The electrical current supplied to the conductor array generates an electromagnetic field that interacts with the magnetic field of the magnet arrays. This generates a controlled force that can be used to move the conductor array relative to the magnet arrays along a first axis.

Unfortunately, electrical current supplied to the conductor array also produces uncontrolled forces along a second axis (shown as the Z axis in the figures) that is orthogonal to the first axis, along a third axis (shown as the X axis in the figures) that is orthogonal to the first and second axes, and about the second axis. These forces can cause disturbances that are transferred to other components of the exposure apparatus and positional error.

SUMMARY

The present invention is directed to an actuator for applying independently controlled forces to a stage along a first axis, along a second axis that is perpendicular to the first axis, and along a third axis that is perpendicular to the first axis and the second axis. The actuator includes a magnetic component, a conductor component, and a control system. The magnetic component includes a plurality of magnets arranged in an array along the first axis that produce a magnetic field. The conductor component is positioned near the magnetic component. Further, the conductor component interacts with the magnetic field when current is directed to the conductor component. The control system directs current to the conductor component to generate a controllable force along the first axis, a controllable force along the second axis, and a controllable force along the third axis. With this design, the same mover can be used to move the stage along three degrees of freedom ("DOF").

In some embodiments, the conductor component includes a split coil design. In such embodiments, the conductor component can include a first conductor array and a second conductor array that is positioned substantially adjacent to the first conductor array. The control system independently directs current to each of the conductor arrays to generate a controllable force along the first axis, along the second axis, and along the third axis.

In one embodiment, the first conductor array is shifted along the first axis relative to the second conductor array. In such embodiment, the control system independently directs current to the first conductor array and the second conductor array to generate a controllable moment about the third axis. In certain Figures illustrated herein, the Y axis corresponds to the first axis, the Z axis corresponds to the second axis, and the X axis corresponds to the third axis. However, it should be noted that any of the Y axis, the Z axis and the X axis can be referred to as the first, second, and/or third axes.

In some embodiments, the conductor component and the magnetic component are displaced relative to each other along the third axis. The conductor component can include an upper endturn and a lower endturn, wherein different percentages of the upper endturn and the lower endturn lie within the magnetic field of the magnetic component. In such embodiments, the control system directs current to the conductor component to generate a controllable force along the third axis.

In one embodiment, the magnetic component includes a first magnetic array and a second magnetic array that are positioned on opposite sides of the conductor component.

Further, the present invention is also directed to a stage assembly, an exposure apparatus, a method for moving a device, a method for making an exposure apparatus, and a method for manufacturing a device or a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
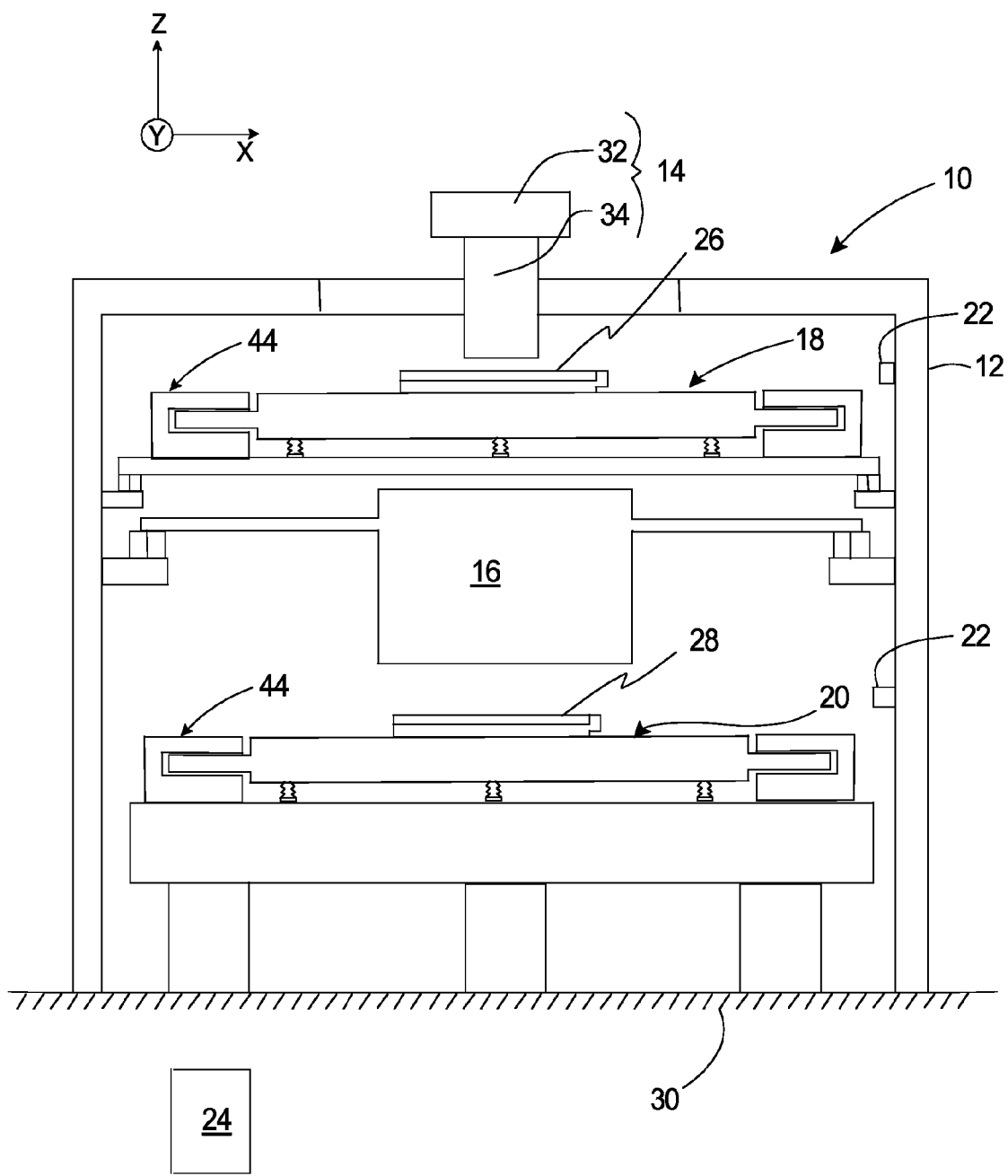
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

As an overview, in certain embodiments, one or both of the stage assemblies 18, 20 are uniquely designed to move and position a device with improved accuracy. More specifically, in certain embodiments, one or both stage assemblies 18, 20 includes one or more linear type movers 44 which can be controlled to independently generate controllable forces along a Y axis, along a Z axis, and along an X axis. This allows for the cancellation of undesired ripple in the forces along the Z axis, and along the X axis; and/or the active generation of non-zero forces along the Y axis, along the Z axis, and/or along the X axis to accurately position the device. As a result thereof, the linear type motors can position a stage with improved accuracy, and the exposure apparatus 10 can be used to manufacture higher density wafers.

A number of Figures include an orientation system that illustrates the X axis, the Y axis that is orthogonal to the X axis, and the Z axis that is orthogonal to the X and Y axes. It should be noted that any of these axes can also be referred to as the first, second, and/or third axes.

The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, or floor or some other supporting structure.

There are a number of different types of lithographic devices. For example, the exposure apparatus 10 can be used as a scanning type photolithography system that exposes the pattern from the reticle 26 onto the wafer 28 with the reticle 26 and the wafer 28 moving synchronously. Alternatively, the exposure apparatus 10 can be a step-and-repeat type photolithography system that exposes the reticle 26 while the reticle 26 and the wafer 28 are stationary.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports the components of the exposure apparatus 10. The apparatus frame 12 illustrated in FIG. 1 supports the reticle stage assembly 18, the optical assembly 16 and the illumination system 14 above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The beam illuminates selectively different portions of the reticle 26 and exposes the wafer 28. In FIG. 1, the illumination source 32 is illustrated as being supported above the reticle stage assembly 18. Typically, however, the illumination source 32 is secured to one of the sides of the apparatus frame 12 and the energy beam from the illumination source 32 is directed to above the reticle stage assembly 18 with the illumination optical assembly 34.

The illumination source 32 can be a g-line source (436 nm), an i-line source (365 nm), a KrF excimer laser (248 nm), an ArF excimer laser (193 nm), a $F_2$ laser (157 nm), or an EUV source (13.5 nm). Alternatively, the illumination source 32 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs EUV radiation (EUV) of wavelength 13.5 nm or lower, use of the catadioptric type optical system can be considered. For EUV the entire optical path should be in a vacuum. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 26 relative to the optical assembly 16 and the wafer 28.

Somewhat similarly, the wafer stage assembly 20 holds and positions the wafer 28 with respect to the projected image of the illuminated portions of the reticle 26.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528, 100 and 5,874,820 and Japanese Patent Application Disclosure No. 8-330224 are incorporated herein by reference.

The measurement system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, and/or other measuring devices.

The control system 24 is connected to the reticle stage assembly 18, the wafer stage assembly 20, and the measurement system 22. The control system 24 receives information from the measurement system 22 and controls the stage assemblies 18, 20 to precisely position the reticle 26 and the wafer 28. The control system 24 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2:
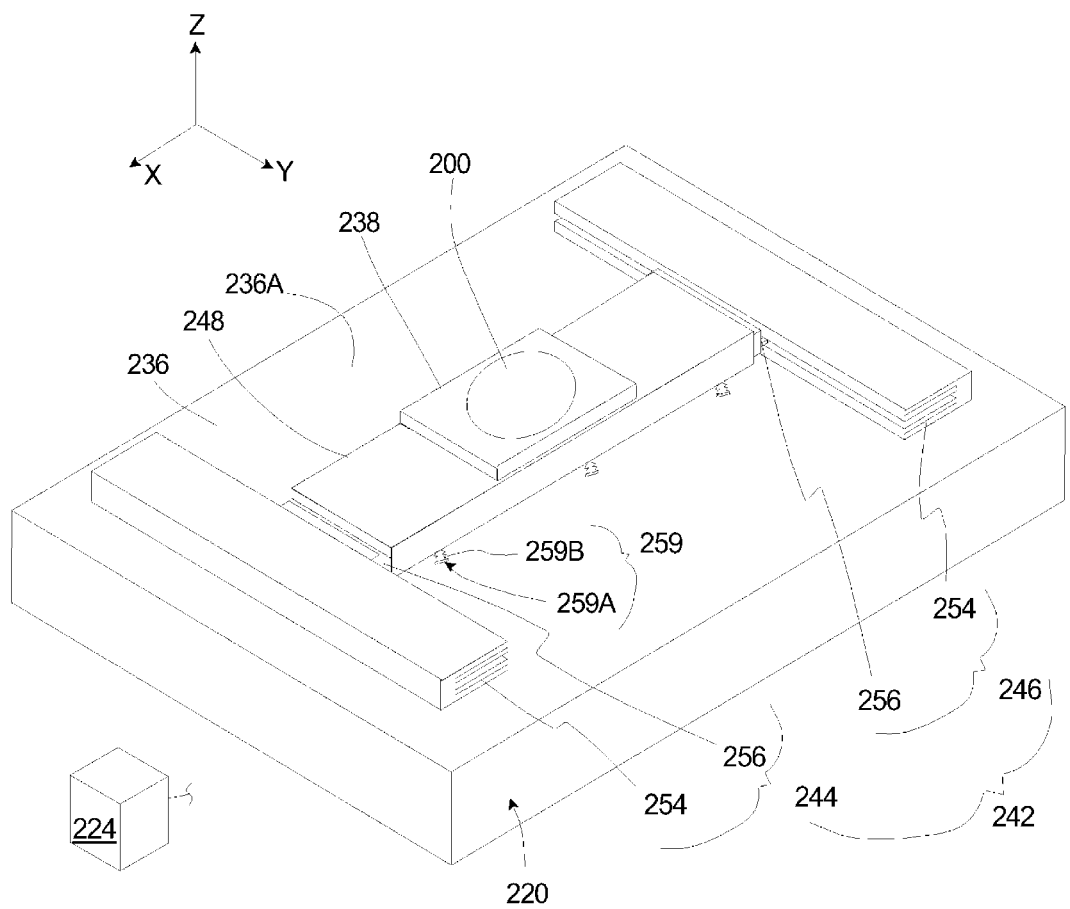
FIG. 2 is a simplified top perspective view of a stage assembly having features of the present invention.

FIG. 2 is a simplified top perspective view of a control system 224 and one embodiment of a stage assembly 220 that is used to position a work piece 200. For example, the stage assembly 220 can be used as the wafer stage assembly 20 in the exposure apparatus 10 of FIG. 1. In this embodiment, the stage assembly 220 would position the wafer 28 (illustrated in FIG. 1) during manufacturing of the semiconductor wafer 28. Alternatively, the stage assembly 220 can be used to move other types of work pieces 200 during manufacturing and/or inspection, to move a device under an electron microscope (not shown), or to move a device during a precision measurement operation (not shown). For example, the stage assembly 220 could be designed to function as the reticle stage assembly 18 illustrated in FIG. 1.

In FIG. 2, the stage assembly 220 includes a stage base 236, a stage 238, and a stage mover assembly 242. The size, shape, and design of each these components can be varied. The control system 224 precisely controls the stage mover assembly 242 to precisely position the work piece 200.

In FIG. 2, the stage base 236 supports some of the components of the stage assembly 220 and guides the movement of the stage 238 along the X axis, along the Y axis and about the Z axis. In certain embodiments, the stage base 236 is generally rectangular shaped and includes a generally planar guide surface 236A that directly or indirectly supports and/or guides movement of the stage 238. In this embodiment, the guide surface 236A extends along the X and Y axes.

The stage 238 retains the work piece 200. In one embodiment, the stage 238 is generally rectangular shaped and includes a chuck (not shown) for holding the work piece 200.

The stage mover assembly 242 moves and positions the stage 238. In FIG. 2, the stage mover assembly 242 includes a first mover 244, a spaced apart second mover 246, and a connector bar 248 that extends between the movers 244, 246.

The design of each mover 244, 246 can be varied to suit the movement requirements of the stage mover assembly 242. In FIG. 2, each of the movers 244, 246 includes a first mover component 254 and a second mover component 256 that interacts with the first mover component 254. In this embodiment, each of the movers 244, 246 is a uniquely designed and controlled linear motor, and one of the mover components 254, 256 is a magnetic component that includes one or more magnets, and one of the mover components 256, 254 is a conductor component that includes one or more conductors, e.g. coils. In FIG. 2, the first mover component 254 is the magnetic component and the second mover component 256 is the conductor component. Alternatively, the first mover component 254 can be the conductor component and the second mover component 256 can be the magnetic component.

In FIG. 2, for each mover 244, 246, the first mover component 254 is coupled to the stage base 236 and the second mover component 256 is secured to the connector bar 248. Alternatively, for example, the first mover component 254 of one or more of the movers 244, 246 can be secured to a counter/reaction mass or a reaction frame (not shown).

The connector bar 248 supports the stage 238 and is moved by the movers 244, 246. In FIG. 2, the connector bar 248 is somewhat rectangular beam shaped.

Additionally, in the embodiment illustrated in FIG. 2, at least a portion of the weight of the connector bar 248, the stage 238, and the work piece 200 is supported along the Z axis relative to the stage base 236 with one or more support bearings 259 (two are illustrated in FIG. 2). In this embodiment, for example, the one or more support bearings 259 can support the dead weight of the connector bar 248, the stage 238, and the work piece 200 while allowing the movers 244, 246 to move and precisely position these components along the Z axis, about the X axis, and about the Y axis. Further, because the dead weight of these components is supported by the support bearings 259, the movers 244, 246 do not have to support these components and the movers 244, 246 are used for fine positional control along the Z axis, about the X axis, and about the Y axis. This reduces the amount of power consumed by the movers 244, 246 and the amount of heat generated by the movers 244, 246.

In one non-exclusive embodiment, each of the support bearings 259 can include a fluid bearing pad 259A that creates a vacuum preload type fluid bearing that supports the bearing pad 259A relative to the stage base 236, and a fluid bellows 259B that flexibly connects the bearing pad 259A to the connector bar 248. Alternatively, the bearing pad 259A can be replaced with another type of fluid bearing, a magnetic type bearing, or a roller type assembly and/or the fluid bellows 259B can be replaced with another type of flexible connector.

In FIG. 2, in certain embodiments, the control system 224 directs current to the second mover component 256 (i.e., the conductor component) of each mover 244, 246 to generate a controllable force for each mover 244, 246 along the Y axis ("first axis"), to generate a controllable force for each mover 244, 246 along the Z axis ("second axis"), and to generate a controllable force for each mover 244, 246 along the X axis ("third axis"). The control system 224 is described in more detail below.

Figure 3A:
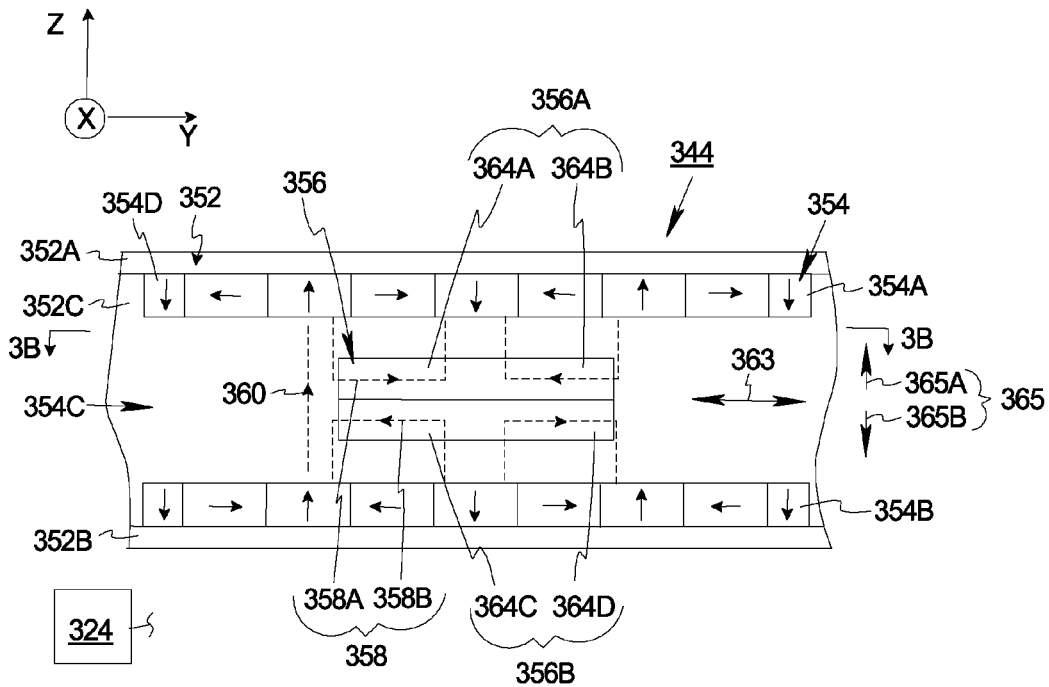
FIG. 3A is a simplified side view of a first embodiment of a mover having features of the present invention.

FIG. 3A is a simplified side view of a first embodiment of a mover 344 that can be used as the first mover 244 or the second mover 246 in FIG. 2, or for another usage. In this embodiment, the mover 344 includes a mover frame 352, a magnetic component 354, a conductor component 356, and a control system 324. Alternatively, the mover 344 can be designed with more or fewer components than that illustrated in FIG. 3A.

Figure 3B:
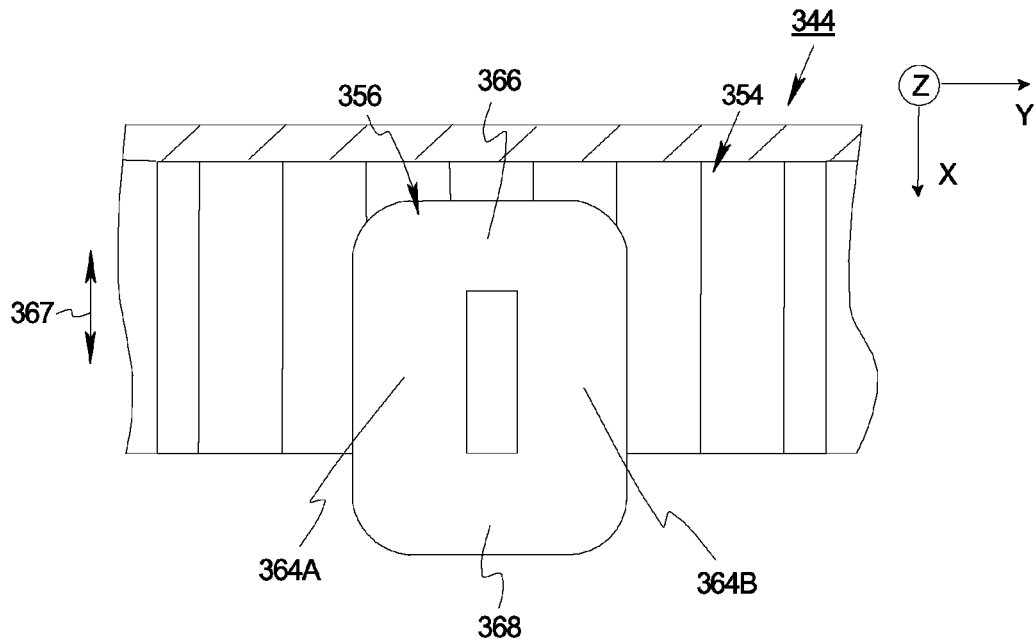
FIG. 3B is a simplified cut-away view taken on line 3B-3B of FIG. 3A.

FIG. 3B is a simplified cut-away view taken on line 3B-3B in FIG. 3A. More specifically, FIG. 3B illustrates a simplified top view of the mover 344 of FIG. 3A with one of the magnet arrays (e.g. the upper magnet array 354A) of the magnetic component 354 removed so that the positioning of the conductor component 356 relative to the magnetic component 354 is more clear.

In this embodiment, the mover 344 is uniquely designed to move and position a device 200 (illustrated in FIG. 2) with improved accuracy, or with fewer physical actuators. In this embodiment, the mover 344 can be an actuator used for applying independently controlled forces to a stage 238 (illustrated in FIG. 2) along a first axis (the Y axis), along a second axis (the Z axis), and along a third axis (the X axis). More specifically, in this embodiment, the mover 344 is a linear type motor that can be controlled by the control system 324 to generate independently controllable forces along the first axis, along the second axis, and along the third axis.

As shown in FIG. 3A, the mover frame 352 supports some of the components of the mover 344. In one embodiment, the mover frame 352 is generally rigid and shaped somewhat similar to a sideways "U". In FIG. 3A, the mover frame 352 includes a generally flat, rectangular shaped, upper side 352A, a generally flat, rectangular shaped, lower side 352B that is spaced apart from the upper side 352A, and a generally rectangular shaped connector side 352C that connects the upper side 352A and the lower side 352B. In some embodiments, portions of the mover frame 352 can be made of a highly magnetically permeable material, such as a soft iron that provides some shielding of the magnetic fields, as well as providing a low reluctance magnetic flux return path for the magnetic fields of the magnetic component 354. In the embodiment shown in FIGS. 3A-3C, the magnet array is a Halbach array which does not require a magnetically permeable material in the mover frame. Other types of magnet arrays may also be used.

In one embodiment, the mover frame 352 is secured to the stage base 236 (illustrated in FIG. 2) or a reaction type (e.g., a reaction frame or a countermass) assembly. In this embodiment, the conductor component 356 is secured to the connector bar 248 (illustrated in FIG. 2) and moves relative to the magnetic component 354. Alternatively, for example, the conductor component 356 can be secured to the stage base 236, the magnetic component 354 can be secured to the connector bar 248, and the magnetic component 354 can be moved relative to the conductor component 356.

The magnetic component 354 produces a magnetic field, which is preferably strongest in the space between upper side 352A and lower side 352B. In FIG. 3A, the magnetic component 354 includes an upper magnet array 354A that is secured to the upper side 352A, and a lower magnet array 354B that is secured to the lower side 352B. With this design, the magnet arrays 354A, 354B are secured to opposite sides of the mover frame 352, on opposite sides of the conductor component 356, and a magnet gap 354C separates the magnet arrays 354A, 354B.

Each of the magnet arrays 354A, 354B includes a plurality of magnets 354D arranged in an array along the Y axis that produce a magnetic field. The design, the positioning, and the number of magnets 354D in each magnet array 354A, 354B can be varied to suit the design requirements of the mover 344. In FIG. 3A, each magnet array 354A, 354B includes nine (9), rectangular shaped magnets 354D that are aligned side-by-side linearly. Further, in FIG. 3A, the magnets 354D in each magnet array 354A, 354B are orientated so that the poles facing the magnet gap 354C alternate between the North pole, transversely oriented, and the South pole. This type of array is commonly referred to as a Halbach array. Alternatively, each magnet array 354A, 354B can be designed without the transversely oriented magnets. Further, each magnet array 354A, 354B can include more than nine or fewer than nine magnets 354D. Typically, each magnet array 354A, 354B is much longer along the primary axis of movement (the Y axis in FIG. 3A) for a linear motor in which the conductor component 356 moves relative to the magnetic component 354.

Each of the magnets 354D can be made of a high energy product, rare earth, permanent magnetic material such as NdFeB. Alternatively, for example, each magnet 354D can be made of a low energy product, ceramic or other type of material that is surrounded by a magnetic field.

The magnetic orientation of each of the magnets 354D are illustrated in FIG. 3A as arrows. As shown in FIG. 3A, the polarity of the pole facing the magnet gap 354C of each of the magnets 354D in the upper magnet array 354A is opposite from the polarity of the pole facing the magnet gap 354C of the corresponding magnet 354D in the lower magnet array 354B. Thus, North poles face South poles across the magnet gap 354C. This leads to strong magnetic fields in the magnet gap 354C and strong force generation capability.

In this embodiment, the magnetic component 354 creates a first axis magnetic flux 358 (partly illustrated schematically as dashed arrows) having a portion that is oriented substantially horizontally along the Y axis, and a second axis magnetic flux 360 (also partly illustrated as dashed arrows) that is oriented substantially vertically along the Z axis (perpendicular to the Y axis) across the magnetic gap 354C. The first axis magnetic flux 358 can be separated into an upper first magnetic flux 358A that is adjacent the first magnet array 354A and a lower first magnetic flux 358B that is adjacent the second magnet array 354B.

It should be noted that because of manufacturing tolerances the upper first magnetic flux 358A can have a magnitude that is not exactly equal to the magnitude of the lower first magnetic flux 358B, and that the directions of the magnetic flux may deviate somewhat from the desired direction and strength.

The conductor component 356 is positioned near and interacts with the magnet component 354, and is positioned and moves within the magnetic gap 354C and in the magnetic fluxes 358, 360. In the embodiment illustrated in FIG. 3A, the conductor component 356 has a split coil design with two coils stacked on top of each other. In this embodiment, the conductor component 356 includes a conductor housing (not illustrated in FIG. 3A), a first conductor array 356A, and a second conductor array 356B that is positioned substantially adjacent to the first conductor array 356A. Each conductor array 356A, 356B includes one or more conductors, e.g. coils that are embedded into the conductor housing. The number of conductors in each conductor array 356B, 356C can vary to achieve the movement requirements of the mover 344. In FIG. 3A, for simplicity, each conductor array 356A, 356B is illustrated as having a single coil. Alternatively, each conductor array 356A, 356B can include a plurality of coils. For example, each of the conductor arrays 356A, 356B can include a multiple of three coils so that each of the conductor arrays 356A, 356B can be operated as a three phase motor.

More specifically, in this embodiment, the first conductor array 356A has a first upper coil leg 364A and a second upper coil leg 364B, and the second conductor array 356B has a first lower coil leg 364C and a second lower coil leg 364D. With the split coil design, the first upper coil leg 364A is split from the first lower coil leg 364C, with the first lower coil leg 364C being positioned below the first upper coil leg 364A. Somewhat similarly, the second upper coil leg 364B is split from the second lower coil leg 364D, with the second lower coil leg 364D being positioned below the second upper coil leg 364B. In this embodiment, each upper coil leg 364A, 364B is positioned to interact substantially with the upper first magnetic flux 358A and each lower coil leg 364C, 364D is positioned to interact substantially with the lower first magnetic flux 358B. At other positions of the stage, the coil legs 364A-D also interact with magnetic flux 360.

The control system 324 directs and controls the electrical current to the conductor component 356 to control movement of one of the components 356, 354 relative to the other component 354, 356. With the design illustrated in FIG. 3A, the control system 324 independently directs current to each of the conductor arrays 356A, 356B. As provided herein, electric current that is directed to the conductor component 356 by the control system 324 interacts with the magnetic fields that surround the magnet component 354 to generate (i) a Y driving force 363 (illustrated as a two headed arrow) along the Y axis that can move the conductor component 356 along the Y axis, (ii) a Z driving force 365 (illustrated as two arrows, 365A and 365B) along the Z axis that acts on the conductor component 356 substantially transversely to the Y axis, and (iii) an X driving force 367 (illustrated as a two headed arrow in FIG. 3B) along the X axis that acts on the conductor component 356 substantially transversely to the Y axis and the Z axis. With this design, the movement of the conductor component 356 can be controlled along three axes, namely along the Y axis, along the Z axis, and along the X axis. Thus, the mover 344 can be used to precisely and controllably position the stage 238 (illustrated in FIG. 2) along the Y axis, the Z axis, and the X axis.

Referring now to FIG. 3B, as noted above, FIG. 3B illustrates a cut-away view of the mover 344, wherein the upper magnet array 354A of the magnetic component 354 has been removed for purposes of clarity. Additionally, only a portion of the conductor component 356 is visible in FIG. 3B. Stated another way, only the first conductor array 356A is visible in FIG. 3B, with the second conductor array 356B (illustrated in FIG. 3A) being positioned directly behind, below, and adjacent to the first conductor array 356A.

In one embodiment, the coil in the first conductor array 356A of the conductor component 356 has a racetrack coil configuration, wherein the coil includes the first upper coil leg 364A, the second upper coil leg 364B, an upper endturn 366, and a lower endturn 368. In this embodiment, the coil of the second conductor array 356B (not shown in FIG. 3B) has a similar configuration.

In this embodiment, the upper endturn 366 and the lower endturn 368 are somewhat semi-circular in shape, and each of the upper endturn 366 and the lower endturn 368 extend between the first upper coil leg 364A and the second upper coil leg 364B so as to form the substantially oval-shaped racetrack coil configuration. In an alternative embodiment, the first conductor array 356A can be designed so that the coil is wound in a more rectangular shape rather than having the oval racetrack coil configuration. Such alternative design can improve the thrust efficiency along the X axis (because the endturns 366, 368 are larger), while decreasing some efficiency along the Y axis (because the coil legs 364A, 364B are shorter). Still alternatively, the conductor component 356 can be designed to include conductor arrays having a plurality of overlapping conductors. Non-exclusive examples of such conductor arrays will be illustrated in greater detail below.

During operation of the mover 344, the control system 324 directs varying magnitudes of current in varying directions to the first conductor array 356A, and the control system 324 independently directs varying magnitudes of current in varying directions to the second conductor array 356B. For example, in the embodiment shown in FIG. 3B, the control system 324 (not illustrated in FIG. 3B) can direct varying magnitudes of current in the clockwise direction to the first conductor array 356A. Stated another way, with current flowing in the clockwise direction to the first conductor array 356A, the current will be flowing in the +X direction in the first upper coil leg 364A, and the current will be flowing in the −X direction in the second upper coil leg 364B. Somewhat similarly, the control system 324 can direct varying magnitudes of current in the counter-clockwise direction to the first conductor array 356A. Stated another way, with current flowing in the counter-clockwise direction to the first conductor array 356A, the current will be flowing in the −X direction in the first upper coil leg 364A, and the current will be flowing in the +X direction in the second upper coil leg 364B.

Referring back to FIG. 3A, the generation of the Y driving force 363 is described in more detail. Somewhat similar to a standard linear motor, the Y driving force 363 is generated by directing current to the legs of the coils of the conductor arrays 356A 356B while the coils of the conductor arrays 356A, 356B are positioned to interact with the second axis magnetic flux 360. As provided herein, the control system 324 can control the direction and magnitude of current to the coils of the conductor arrays 356A 356B to control the magnitude and direction of the Y driving force 363.

More specifically, by applying the proper amount of current in the proper direction (determined by knowing the position of the coils of the conductor arrays 356A, 356B relative to the second axis magnetic flux 360) to the coil of the first conductor array 356A and the coil of the second conductor array 356B, a desired Y driving force 363 can be applied to the stage. For example, when the control system 324 directs current in the clockwise direction to the coil of the first conductor array 356A, the current will be effectively directed into the page (in FIG. 3A) in the first upper coil leg 364A and current will be effectively directed out of the page (in FIG. 3A) in the second upper coil leg 364B. If the first upper coil leg 364A is positioned where the second axis magnetic flux 360 is directed in the +Z direction, the resultant Y driving force 363 will be in the +Y direction. Additionally, if the first upper coil leg 364A is positioned where the second axis magnetic flux 360 is directed in the −Z direction, the resultant Y driving force 363 will be in the −Y direction. Further, if the second upper coil leg 364B is positioned where the second axis magnetic flux 360 is directed in the +Z direction, the resultant Y driving force 363 will be in the −Y direction. Additionally, if the second upper coil leg 364B is positioned where the second axis magnetic flux 360 is directed in the −Z direction, the resultant Y driving force 363 will be in the +Y direction.

Somewhat similarly, when the control system 324 directs current in the counter-clockwise direction to the coils of the first conductor array 356A, the current will be effectively directed out of the page (in FIG. 3A) in the first upper coil leg 364A and current will be effectively directed into the page (in FIG. 3A) in the second upper coil leg 364B. If the first upper coil leg 364A is positioned where the second axis magnetic flux 360 is directed in the +Z direction, the resultant Y driving force 363 will be in the −Y direction. Additionally, if the first upper coil leg 364A is positioned where the second axis magnetic flux 360 is directed in the −Z direction, the resultant Y driving force 363 will be in the +Y direction. Further, if the second upper coil leg 364B is positioned where the second axis magnetic flux 360 is directed in the +Z direction, the resultant Y driving force 363 will be in the +Y direction. Additionally, if the second upper coil leg 364B is positioned where the second axis magnetic flux 360 is directed in the −Z direction, the resultant Y driving force 363 will be in the −Y direction.

Referring now to the second conductor array 356B, when the control system 324 directs current in the clockwise direction to the coil of the second conductor array 356B, the current will be effectively directed into the page (in FIG. 3A) in the first lower coil leg 364C and current will be effectively directed out of the page (in FIG. 3A) in the second lower coil leg 364D. If the first lower coil leg 364C is positioned where the second axis magnetic flux 360 is directed in the +Z direction, the resultant Y driving force 363 will be in the +Y direction. Additionally, if the first lower coil leg 364C is positioned where the second axis magnetic flux 360 is directed in the −Z direction, the resultant Y driving force 363 will be in the −Y direction. Further, if the second lower coil leg 364D is positioned where the second axis magnetic flux 360 is directed in the +Z direction, the resultant Y driving force 363 will be in the −Y direction. Additionally, if the second lower coil leg 364D is positioned where the second axis magnetic flux 360 is directed in the −Z direction, the resultant Y driving force 363 will be in the +Y direction.

Somewhat similarly, when the control system 324 directs current in the counter-clockwise direction to the coil of the second conductor array 356B, the current will be effectively directed out of the page (in FIG. 3A) in the first lower coil leg 364C and current will be effectively directed into the page (in FIG. 3A) in the second lower coil leg 364D. If the first lower coil leg 364C is positioned where the second axis magnetic flux 360 is directed in the +Z direction, the resultant Y driving force 363 will be in the −Y direction. Additionally, if the first lower coil leg 364C is positioned where the second axis magnetic flux 360 is directed in the −Z direction, the resultant Y driving force 363 will be in the +Y direction. Further, if the second lower coil leg 364D is positioned where the second axis magnetic flux 360 is directed in the +Z direction, the resultant Y driving force 363 will be in the +Y direction. Additionally, if the second lower coil leg 364D is positioned where the second axis magnetic flux 360 is directed in the −Z direction, the resultant Y driving force 363 will be in the −Y direction.

Therefore, depending on the magnitude and the direction of the current directed to the coil of the first conductor array 356A and the coil of the second conductor array 356B, and depending on the magnitude and the direction of the second axis magnetic flux 360, which is determined by the relative position of the magnet array and the conductor array, the Y driving force 363 can be in the −Y direction, in the +Y direction, or substantially zero.

Further, as provided herein, the Z driving force 365 can be separated into an upper driving force 365A that results from directing current to the first conductor array 356A while the first conductor array 356A is positioned in the upper first magnetic flux 358A, and a lower driving force 365B that results from directing current to the second conductor array 356B while the second conductor array 356B is positioned in the lower first magnetic flux 358B. In FIG. 3A, depending upon the direction of the current in coils of the conductor arrays 356A, 356B and the position of the coils of the conductor component 356 along the Y axis, the upper driving force 365A can be directed up or down (i.e., in the +Z or −Z directions) and the lower driving force 365B can be independently directed down or up (i.e., in the +Z or −Z directions).

For example, when the control system 324 directs current in the clockwise direction to the coil of the first conductor array 356A, the current will be effectively directed into the page (in FIG. 3A) in the first upper coil leg 364A and current will be effectively directed out of the page (in FIG. 3A) in the second upper coil leg 364B. At this time, based on the positioning of the coil of the first conductor array 356A within the upper first magnetic flux 358A, as illustrated in FIG. 3A (i.e., with the upper first magnetic flux 358A directed in the +Y direction adjacent to the first upper coil leg 364A, and with the upper first magnetic flux 358A directed in the −Y direction adjacent to the second upper coil leg 364B), current directed in the clockwise direction to the coil of the first conductor array 356A will result in the upper driving force 365A being directed in the −Z direction.

Somewhat similarly, when the control system 324 directs current in the counter-clockwise direction to the coil of the first conductor array 356A, the current will be effectively directed out of the page (in FIG. 3A) in the first upper coil leg 364A and current will be effectively directed into the page (in FIG. 3A) in the second upper coil leg 364B. Based on the positioning of the coil of the first conductor array 356A within the upper first magnetic flux 358A, as illustrated in FIG. 3A (i.e., with the upper first magnetic flux 358A directed in the +Y direction adjacent to the first upper coil leg 364A, and with the upper first magnetic flux 358A directed in the −Y direction adjacent to the second upper coil leg 364B), current directed in the counter-clockwise direction to the coil of the first conductor array 356A will result in the upper driving force 365A being directed in the +Z direction.

Referring now to the second conductor array 356B, when the control system 324 directs current in the clockwise direction to the coil of the second conductor array 356B, the current will be effectively directed into the page (in FIG. 3A) in the first lower coil leg 364C and current will be effectively directed out of the page (in FIG. 3A) in the second lower coil leg 364D. Based on the positioning of the coil of the second conductor array 356B within the lower first magnetic flux 358B, as illustrated in FIG. 3A (i.e., with the lower first magnetic flux 358B directed in the −Y direction adjacent to the first lower coil leg 364C, and with the lower first magnetic flux 358B directed in the +Y direction adjacent to the second lower coil leg 364D), current directed in the clockwise direction to the coil of the second conductor array 356A will result in the lower driving force 365B being directed in the +Z direction.

Somewhat similarly, when the control system 324 directs current in the counter-clockwise direction to the coil of the second conductor array 356B, the current will be effectively directed out of the page (in FIG. 3A) in the first lower coil leg 364C and current will be effectively directed into the page (in FIG. 3A) in the second lower coil leg 364D. Based on the positioning of the coil of the second conductor array 356B within the lower first magnetic flux 358B, as illustrated in FIG. 3A (i.e., with the lower first magnetic flux 358B directed in the −Y direction adjacent to the first lower coil leg 364C, and with the lower first magnetic flux 358B directed in the +Y direction adjacent to the second lower coil leg 364D), current directed in the counter-clockwise direction to the coil of the second conductor array 356B will result in the lower driving force 365B being directed in the −Z direction.

Therefore, if the control system 324 directs current in the clockwise direction to the coil of the first conductor array 356A and in the clockwise direction to the coil of the second conductor array 356B, when the conductors are positioned as shown in FIG. 3A, the upper driving force 365A will be directed in the −Z direction and the lower driving force 365B will be directed in the +Z direction. So, if the magnitude of the current is equal in the coil of the first conductor array 356A and the coil of the second conductor array 356B, and the upper first magnetic flux 358A is substantially equal to the lower first magnetic flux 358B, the net Z driving force 365 will be approximately zero. Somewhat similarly, if the control system 324 directs current of equal magnitude in the counter-clockwise direction to each of the coil of the first conductor array 356A and the coil of the second conductor array 356B, with the conductors positioned as shown in FIG. 3A, and if the upper first magnetic flux 358A is substantially equal to the lower first magnetic flux 358B, the net Z driving force 365 will again be approximately zero.

With this design, the control system 324 can control the magnitude of the current to the coil of the first conductor array 356A to be different than the magnitude of the current to the coil of the second conductor array 356B to create a net Z driving force 365 that is not zero.

Further, if the control system 324 directs current in the clockwise direction to the coil of the first conductor array 356A and in the counter-clockwise direction to the coil of the second conductor array 356B, when they are positioned as shown in FIG. 3A, the upper driving force 365A will be directed in the −Z direction and the lower driving force 365B will be directed in the −Z direction. Somewhat similarly, if the control system 324 directs current in the counter-clockwise direction to the first conductor array 356A and in the clockwise direction to the second conductor array 356B, the upper driving force 365A will be directed in the +Z direction and the lower driving force 365B will be directed in the +Z direction. Accordingly, in such situations, the net Z driving force 365 will be non-zero.

In sum, by altering the magnitude and the direction of the current that is independently directed to the coils of the first conductor array 356A and the coils of the second conductor array 356B, the split coil design of the coils of the conductor component 356 effectively enables the mover 344 to generate non-zero forces along the Z axis, as well as non-zero forces along the Y axis.

Referring back to FIG. 3B, the unique positioning of the conductor component 356 relative to the magnetic component 354 also allows the control system 324 (illustrated in FIG. 3A) to direct current to the conductor component 356 to generate a controllable non-zero force along the X axis. In FIG. 3B, the relative positions of the conductor component 356 and the magnetic component 354 are displaced along the X axis so that different percentages of the upper endturn 366 and the lower endturn 368 of each of the coils of the conductor arrays 356A, 356B lie within the magnetic field of the magnetic component 354 (and in the magnetic gap 354C directly between the magnet arrays 354A, 354B). In alternative embodiments, the percentage of the upper endturn 366 that lies within the magnetic field of the magnetic component 354 (and in the magnetic gap 354C directly between the magnet arrays 354A, 354B) can range from zero (0) percent to 100 percent. In alternative embodiments, the percentage of the upper endturn 366 that lies within the magnetic field of the magnetic component 354 (and in the magnetic gap 354C directly between the magnet arrays 354A, 354B) can be approximately 0, 10, 25, 40, 50, 60, 75, 90 or 100 percent or some other percent. Somewhat similarly, in certain embodiments, the percentage of the lower endturn 368 that lies within the magnetic field of the magnetic component 354 (and in the magnetic gap 354C directly between the magnet arrays 354A, 354B) can range from zero (0) percent to 100 percent. In alternative embodiments, the percentage of the lower endturn 368 that lies within the magnetic field of the magnetic component 354 (and in the magnetic gap 354C directly between the magnet arrays 354A, 354B) can be approximately 0, 10, 25, 40, 50, 60, 75, 90 or 100 percent or some other percent.

In the embodiment illustrated in FIG. 3B, approximately 100 percent of the upper endturn 366 of the coils lies within the magnetic field of the magnetic component 354 (and in the magnetic gap 354C directly between the magnet arrays 354A, 354B), and approximately zero percent of the lower endturn 368 of the conductor component 356 lies within the magnetic field of the magnetic component 354 (and in the magnetic gap 354C directly between the magnet arrays 354A, 354B). Alternatively, for example, the mover 344 can be designed so that approximately 50 percent of the lower endturn 368 of the conductor component 356 lies within the magnetic field of the magnetic component 354 (and in the magnetic gap 354C directly between the magnet arrays 354A, 354B), and approximately 75 percent of the upper endturn 366 of the conductor component 356 lies within the magnetic field of the magnetic component 354 (and in the magnetic gap 354C directly between the magnet arrays 354A, 354B).

Stated in a different fashion, with the embodiments provided herein, a different percentage of the upper endturn 366 interacts strongly with the magnetic field of the magnetic component 354 (and is positioned in the magnetic gap 354C directly between the magnet arrays 354A, 354B) than the lower endturn 368. In alternative non-exclusive embodiments, the difference in percentage of the upper endturn 366 versus the lower endturn 368 that is subjected to the magnetic field of the magnetic component 354 (and in the magnetic gap 354C directly between the magnet arrays 354A, 354B) can be approximately 5, 10, 20, 40, 60, 80, or 100 percent.

By positioning the coils of the conductor component 356 in a displaced position along the X axis relative to the magnetic component 354, current directed to the coils of the conductor arrays 356A, 356B can generate a controllable force along the X axis, i.e., the X driving force 367 (illustrated as a two headed arrow).

In the present invention, when current is directed to the coils of the conductor arrays 356A, 356B, a net force along the X axis can be generated. For example, with the design illustrated in FIG. 3B, this occurs because the current in the upper endturn 366 of the coils interacts with the magnetic field of the magnetic component 354 to generate a force along the X axis, whereas the current in the lower endturn 368 lies outside the magnetic field of the magnetic component 356 thereby generating less force along the X axis (depending on the amount in which the lower endturn 368 is subjected to the magnetic fields).

As discussed above, in the embodiment illustrated in FIGS. 3A and 3B, the upper endturn 366 of each coil is fully subjected to the magnetic field of the magnetic component 354 (and in the magnetic gap 354C directly between the magnet arrays 354A, 354B) and the lower endturn 368 is completely outside the magnetic field of the magnetic component 354 (and outside the magnetic gap 354C and not positioned between the magnet arrays 354A, 354B). Thus, the current in the lower endturn 368 of the coils will not influence the X force.

For example, when the control system 324 directs current in the clockwise direction to the coils of the conductor arrays 356A, 356B, the current will be effectively directed left to right on the page (in FIG. 3A) in the upper endturn 366, and current will be effectively directed right to left on the page (in FIG. 3A) in the lower endturn 368. If the upper endturn 366 of each coil is positioned where the second axis magnetic flux 360 is directed in the +Z direction, the resulting X driving force from the coils of the conductor arrays 356A, 356B will be in the +X direction (out of the page at FIG. 3A). Alternatively, if the upper endturn 366 of each coil is positioned where the second axis magnetic flux 360 is directed in the −Z direction, the resulting X driving force from the coils of the conductor arrays 356A, 356B will be in the −X direction (into the page at FIG. 3A).

Still alternatively, if the current direction is counterclockwise in the coils, (i) if the upper endturn 366 of each coil is positioned where the second axis magnetic flux 360 is directed in the +Z direction, the resulting X driving force from the coils of the conductor arrays 356A, 356B will be in the −X direction, and (ii) if the upper endturn 366 of each coil is positioned where the second axis magnetic flux 360 is directed in the −Z direction, the resulting X driving force from the coils of the conductor arrays 356A, 356B will be in the +X direction.

In yet another alternative example, the control system 324 can direct current in opposite directions to the coils so that opposing X forces are generated by the coils. The magnitude of the opposing X forces will depend upon the magnitude of the current to the coils.

With this design, the control system 324 can independently control the magnitude and direction of the current to the coils to generate a controllable X force 367.

Stated in another fashion, the mover 344 of the present invention can also be utilized to generate a non-zero force along the X axis. If no force is desired along the X axis for a particular desired movement of the stage 238, then current can be directed to the second conductor array 356B so as to generate a force along the X axis that is equal in magnitude and opposite in direction to the force generated along the X axis by the current directed to the first conductor array 356A.

Commutation to produce the X driving force 367 along the X axis is done similarly to the commutation to produce the Y driving force 363 (illustrated in FIG. 3A) along the Y axis, except that it is shifted 90 degrees out of phase along the Y axis. The commutation equations for producing each of the Y driving force 363, the Z driving force 365 and the X driving force 367 of one embodiment of the mover 344 are as follows:

$$\begin{pmatrix} I_{phase1} \\ I_{phase2} \\ I_{phase3} \\ I_{phase4} \\ I_{phase5} \\ I_{phase6} \end{pmatrix} = \begin{bmatrix} \cos\left(\frac{y\cdot\pi}{pitch}\right) & \sin\left(\frac{y\cdot\pi}{pitch}\right) & \cos\left(\frac{y\cdot\pi}{pitch}\right) \\ \cos\left(\frac{y\cdot\pi}{pitch}-\frac{4\cdot\pi}{3}\right) & \sin\left(\frac{y\cdot\pi}{pitch}-\frac{4\cdot\pi}{3}\right) & \cos\left(\frac{y\cdot\pi}{pitch}-\frac{4\cdot\pi}{3}\right) \\ \cos\left(\frac{y\cdot\pi}{pitch}-\frac{2\cdot\pi}{3}\right) & \sin\left(\frac{y\cdot\pi}{pitch}-\frac{2\cdot\pi}{3}\right) & \cos\left(\frac{y\cdot\pi}{pitch}-\frac{2\cdot\pi}{3}\right) \\ \cos\left(\frac{y\cdot\pi}{pitch}\right) & \sin\left(\frac{y\cdot\pi}{pitch}\right) & -\cos\left(\frac{y\cdot\pi}{pitch}\right) \\ \cos\left(\frac{y\cdot\pi}{pitch}-\frac{4\cdot\pi}{3}\right) & \sin\left(\frac{y\cdot\pi}{pitch}-\frac{4\cdot\pi}{3}\right) & -\cos\left(\frac{y\cdot\pi}{pitch}-\frac{4\cdot\pi}{3}\right) \\ \cos\left(\frac{y\cdot\pi}{pitch}-\frac{2\cdot\pi}{3}\right) & \sin\left(\frac{y\cdot\pi}{pitch}-\frac{2\cdot\pi}{3}\right) & -\cos\left(\frac{y\cdot\pi}{pitch}-\frac{2\cdot\pi}{3}\right) \end{bmatrix} \cdot \begin{pmatrix} u_x \\ u_y \\ u_z \end{pmatrix}$$

The above commutation equations are applicable assuming that each of the first conductor array 356A and the second conductor array 356B are three-phase windings. Accordingly, the commutation equations matrix includes six rows, one for each of the three phases for each of the first conductor array 356A and the second conductor array 356B. Additionally, the commutation equations matrix includes three columns for the three force directions, with $u_x$, $u_y$ and $u_z$ being the desired scaled force in the X direction, the Y direction and the Z direction, respectively. Further, "pitch" refers to the magnetic pitch, i.e., the distance along the Y axis between adjacent North (or South) poles.

In summary, by utilizing the split coil design for the conductor component 356, as illustrated in FIG. 3A, and by utilizing the control system 324 to individually direct current to the coils of the first conductor array 356A and the second conductor array 356B, the mover 344 is able to generate controllable forces along the Y axis and along the Z axis. Additionally, by positioning the conductor component 356 in a displaced position along the X axis relative to the magnetic component 354, as illustrated in FIG. 3B, and by utilizing the control system 324 to direct current to the coils of the conductor component 356, the mover 344 is able to generate controllable forces along the Y axis and along the X axis.

Uniquely, when using these two design features in combination, i.e., by utilizing the split coil design for the conductor component 356, as illustrated in FIG. 3A, by positioning the conductor component 356 in a displaced position along the X axis relative to the magnetic component 354, as illustrated in FIG. 3B, and by utilizing the control system 324 to individually direct current to the coils of the first conductor array 356A and the second conductor array 356B, the mover 344 is able to effectively and efficiently generate controllable forces along the Y axis, along the Z axis, and along the X axis.

Figure 3C:
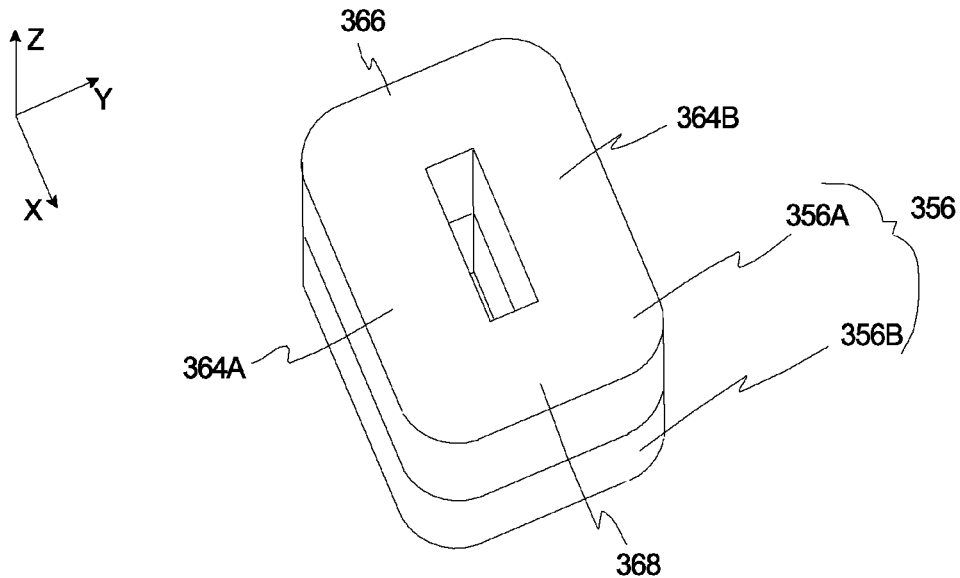
FIG. 3C is a perspective view of a portion of the mover of FIG. 3A.

FIG. 3C is a perspective view of a portion of the mover 344 of FIG. 3A. More particularly, FIG. 3C is a perspective view of the conductor component 356 and illustrates that the first conductor array 356A is stacked substantially directly on top of the second conductor array 356B. The coils legs 364A, 364B, and the endturns 366, 368 are also illustrated in FIG. 3C.

Figure 4A:
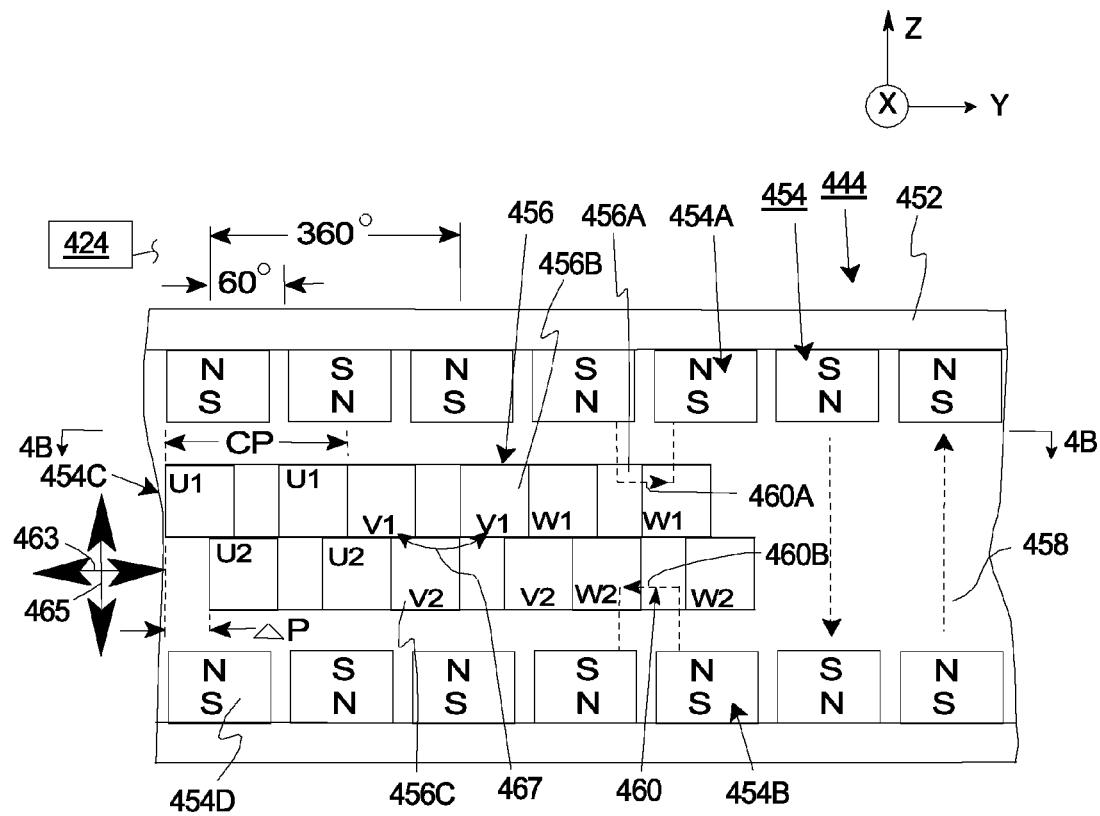
FIG. 4A is a simplified side view of another embodiment of a mover having features of the present invention.

FIG. 4A is a simplified side view of another embodiment of a mover 444 that can be used as the first mover 244 or the second mover 246 in FIG. 2, or for another usage. In this embodiment, the mover 444 includes a mover frame 452, a magnetic component 454, a conductor component 456, and a control system 424. Alternatively, the mover 444 can be designed with more or fewer components than that illustrated in FIG. 4A.

In this embodiment, the mover 444 includes certain features that are substantially similar to certain features present in the embodiment illustrated in FIGS. 3A-3C. For example, the mover frame 452 has a similar shape and serves a similar purpose as the mover frame 352 illustrated in FIG. 3A. Additionally, the conductor component 456 includes a somewhat similar split coil design, and the relative positions of the conductor component 456 and the magnetic component 454 are similarly displaced along the X axis. These basic features enable the mover 444 to effectively and efficiently generate controllable forces along the Y axis, along the Z axis, and along the X axis, similar to the design described above in reference to FIGS. 3A-3C. Additionally, the mover 444 in this embodiment is a linear type motor that can also be controlled by the control system 424 to generate an independently controllable moment about the X axis.

The magnetic component 454 is surrounded by a magnetic field. In FIG. 4A, the magnetic component 454 again includes an upper magnet array 454A and a lower magnet array 454B that are secured to opposite sides of the mover frame 452, and a magnet gap 454C that separates the magnet arrays 454A, 454B. In FIG. 4A, each magnet array 454A, 454B is similar to the magnet arrays 354A, 354B of the mover 344 illustrated in FIG. 3A, except that the transverse magnets are removed and the magnets of alternating polarity are spaced apart. It should be noted that the distance from North pole to North pole along the Y axis is the magnetic pitch and is considered to be 360 degrees. This type of magnet array is well known in the art as a magnet array for a linear motor.

A portion of the magnetic fields that surround the magnets 454D are illustrated in FIG. 4A and are represented as arrows. In this embodiment, the magnetic component 454 includes a first axis magnetic flux 458 (illustrated as dashed arrows) that is oriented substantially horizontally along the Y axis, and a second axis magnetic flux 460 (illustrated as dashed arrows) that is oriented vertically along the Z axis across the magnetic gap 454C. The first axis magnetic flux 458 can be separated into an upper first magnetic flux 458A that is adjacent the upper magnet array 454A and a lower first magnetic flux 458B that is adjacent the lower magnet array 454B.

The conductor component 456 is positioned near and interacts with the magnet component 454, and is positioned and moves within the magnetic gap 454C. In the embodiment illustrated in FIG. 4A, the conductor component 456 includes a somewhat similar split coil design as is illustrated in the embodiment of FIGS. 3A-3C. As shown in FIG. 4A, the conductor component 456 includes a plurality of conductors 456A (e.g. coils) that are arranged in a first conductor array 456B and plurality of conductors 456A that are arranged in a second conductor array 456C that is positioned adjacent to the first conductor array 456B.

For simplicity, each conductor array 456B, 456C is illustrated as including three conductors 456A. Alternatively, each conductor array 456B, 456C can be designed with more or fewer than three conductors 456A. Further, the conductors 456A in each array 456B, 456C are aligned side by side along the Y axis.

In FIG. 4A, the three conductors 456A of the first conductor array 456B are labeled U1, V1, and W1, respectively, while the three conductors 456A of the second conductor array 456C are labeled U2, V2, and W2.

In certain embodiments, the conductor arrays 456B, 456C are shifted (represented by "ΔP" in FIG. 4A) relative to the each other along the Y axis. As a result of this design, the mover 444 can better be controlled to provide a controllable moment (torque) about the X axis. In FIG. 4A, the second conductor array 456C is shifted in the positive direction (left to right in FIG. 4A) along the Y axis relative to the first conductor array 456A. In this embodiment, U1 is positioned above and partly stacked on U2; V1 is positioned above and partly stacked on U2 and V2; and W1 is positioned above and partly stacked on V2 and W2. Alternatively, the second conductor array 456C can be shifted in the negative direction (right to left in FIG. 4A) along the Y axis relative to the first conductor array 456A.

The amount of shift along the Y axis between the conductor arrays 456B, 456C used in the conductor component 456 can be varied to achieve the desired control level for the conductor arrays 456B, 456C. As used herein, the term "coil pitch" means the width of the coil along the Y axis, and is represented by "CP" in FIG. 4A. Typically, CP is 60 degrees, 120 degrees, 240 degrees, or 300 degrees. In FIG. 4A, the second conductor array 456C is shifted (represented as "ΔP") approximately ¼ of the coil pitch relative to the first conductor array 456B. Stated in another fashion, in this example, if the coil pitch is 240 degrees, the second conductor array 456C is shifted approximately sixty degrees relative to the first conductor array 456B. Alternatively, the second conductor array 456C can be shifted greater than or lesser than ¼ of the coil pitch (60 degrees for the common case of CP=240 degrees) relative to the first conductor array 456A. For example, in an alternative non-exclusive embodiment, the second conductor array 456C can be shifted at least approximately ⅓ of the coil pitch relative to the first conductor array 456B. Stated in another fashion, the second conductor array 456C can be shifted at least approximately 80 degrees relative to the first conductor array 456B.

In this embodiment, the conductors 456A of the first conductor array 456B are positioned substantially within the upper first magnetic flux 458A, and the conductors 456A of the second conductor array 456C are positioned substantially within the lower first magnetic flux 458B. With the design of this embodiment, the control system 424 can direct current to the conductor component 456 to interact with the magnetic fields that surround the magnet component 454 to generate (i) a Y driving force 463 (illustrated as a two headed arrow) along the Y axis that can move the conductor component 456 along the Y axis; (ii) a Z driving force 465 (illustrated as a two headed arrow) along the Z axis that acts on the conductor component 456 along the Z axis; (iii) an X driving force 467 (illustrated as a two headed arrow in FIG. 4B) along the X axis that acts on the conductor component 456 along the X axis; and (iv) a theta X moment 467A (illustrated as a two headed arrow) that acts on the conductor component 456 about the X axis.

More specifically, the control system 424 independently directs and controls the current to each U1 conductor (U1 phase), each V1 conductor (V1 phase), each W1 conductor (W1 phase), each U2 conductor (U2 phase), each V2 conductor (V2 phase), and each W2 conductor (W2 phase). In this embodiment, the control system 424 controls the current to these conductors in different electrical phases to generate the independently controllable Y driving force 463, the independently controllable Z driving force 465, the independently controllable X driving force 467, and the independently controllable theta X moment 467A.

In certain embodiments, the control system 424 directs to each of the conductors 456A a sum of sine waves for each of the desired and controlled Y driving force 463, the Z driving force 465, the X driving force 467, and the theta X moment 467A.

Ignoring for the moment that the relative positions of the conductor component 456 and the magnetic component 454 are displaced along the X axis, as will be discussed below in relation to FIG. 4B, the current to each conductor 456A is determined by two sets of equations: compensation and commutation. The commutation equation for each of the six phases (i.e., U1 phase, V1 phase, W1 phase, U2 phase, V2 phase, W2 phase) is a sum of three sine waves, which substantially correspond with each of the Y force, Z force, and X moment. The input to the commutation equations is the amplitude of each sine wave (three numbers) and the stage Y position, and the output is the current to each of the six phases. The motor produces Y force, Z force, and X moment which are approximately proportional to the three commutation amplitudes (Iy, Iz, and Itx). Typically, however there are errors in each degree of freedom of one to three percent.

Using mapping and compensation techniques, the commutation amplitudes are adjusted slightly to substantially eliminate the force errors. If the behavior of the motor (what force is produced by each of Iy, Iz, and Itx) is known at each Y position, the compensated commutation amplitudes Iyc, Izc, and Itxc can be calculated to produce almost exactly the desired Y force, Z force, and X moment.

When electric currents flow in the conductors 456A, a Lorentz type force is generated in a direction mutually perpendicular to the direction of the wires of the conductors 456A and the magnetic fields in the magnetic gap 354C. If the current magnitudes and polarities are adjusted properly to the alternating polarity of the magnet fields in the magnetic gap 454C, the controllable Y driving force 463, the Z force 465, and the theta X moment 467 is generated.

Figure 4B:
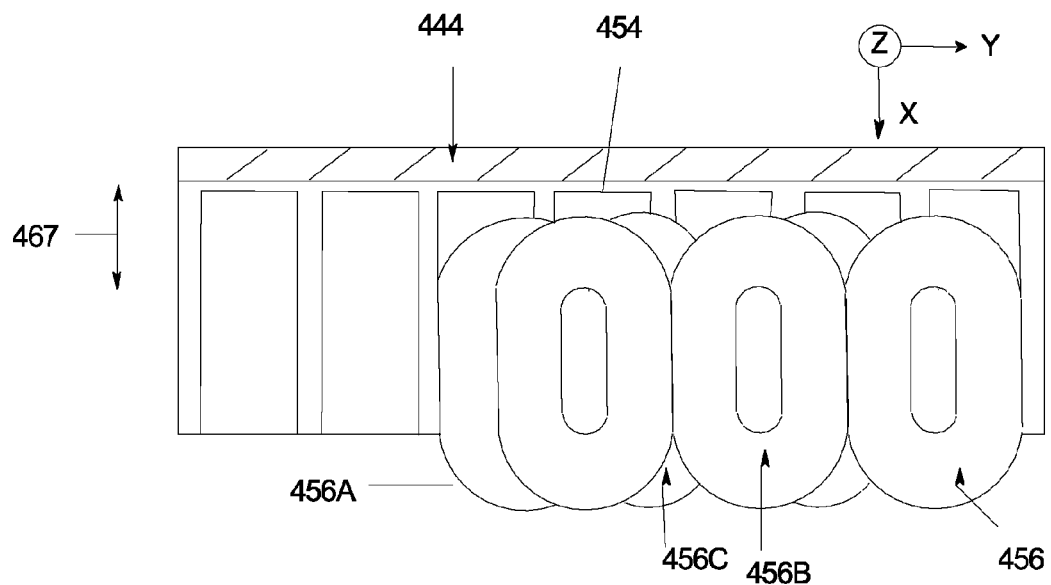
FIG. 4B is a simplified cut-away view taken on line 4B-4B of FIG. 4A.

FIG. 4B is a simplified cut-away view of the mover 444 taken on line 4B-4B of FIG. 4A. Similar to the design illustrated in FIG. 3B, the relative positions of the conductor component 456 and the magnetic component 454 are displaced/offset along the X axis. As discussed in detail above, by positioning the conductor component 456 in a displaced position along the X axis relative to the magnetic component 454, and by utilizing the control system 424 to direct current to the coils of the conductor component 456, the mover 444 is able to generate controllable forces along the Y axis and along the X axis. In this embodiment, each of the conductors 456A has a racetrack coil configuration. Alternatively, the conductors 456A can be designed to have a different configuration.

As noted above, by positioning the conductor component 456 of the mover 444 in a displaced position along the X axis relative to the magnetic component 454, current directed to the conductor arrays 456B, 456C can generate a controllable, non-zero force along the X axis, i.e., the X driving force 467. If no force is desired along the X axis for a particular desired movement of the stage 238, then current can be directed to the second conductor array 456C so as to generate a force along the X axis that is equal in magnitude and opposite in direction to the force generated along the X axis by the current directed to the first conductor array 456B.

Figure 4C:
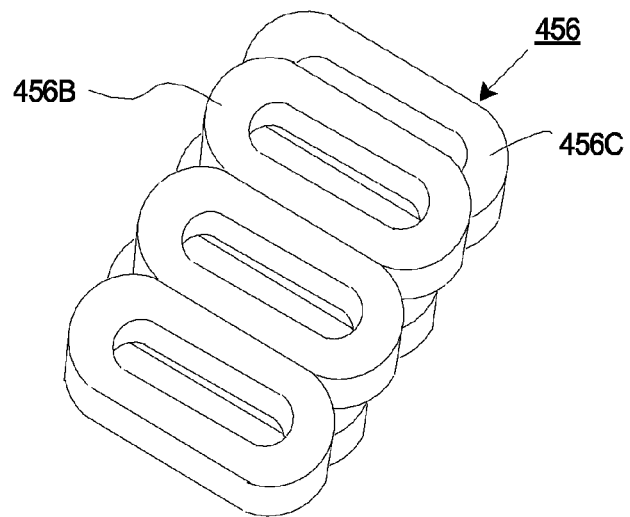
FIG. 4C is a perspective view of a portion of the mover of FIG. 4A.
Figure 5:
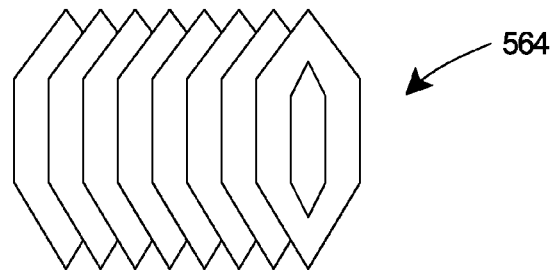
FIG. 5 is a side view of a portion of another embodiment of a conductor array usable with the present invention.

FIG. 4C is a perspective view of a portion of the mover 444 of FIG. 4A. More particularly, FIG. 4C is a perspective view of the conductor component 456 and illustrates that the first array 456B is offset from the second array 456C. It should be noted that the overlapping conductors can have a different shape than described above. For example, FIG. 5 is a side view of a portion of another embodiment of a conductor array usable with the present invention. More specifically, FIG. 5 is a side view of a conductor array including a plurality of hexagonal shaped overlapping conductors 564 that can be used in the mover 344 or the mover 444 described above. For example, if the conductors 564 are used in one of the movers 344, 444, the conductors 564 will need to have a split coil design. A more complete description of the overlapping conductors 564 illustrated in FIG. 5 is provided in U.S. Pat. No. 6,355,993. As far as permitted, the contents of U.S. Pat. No. 6,355,993 are incorporated herein by reference.

Figure 6:
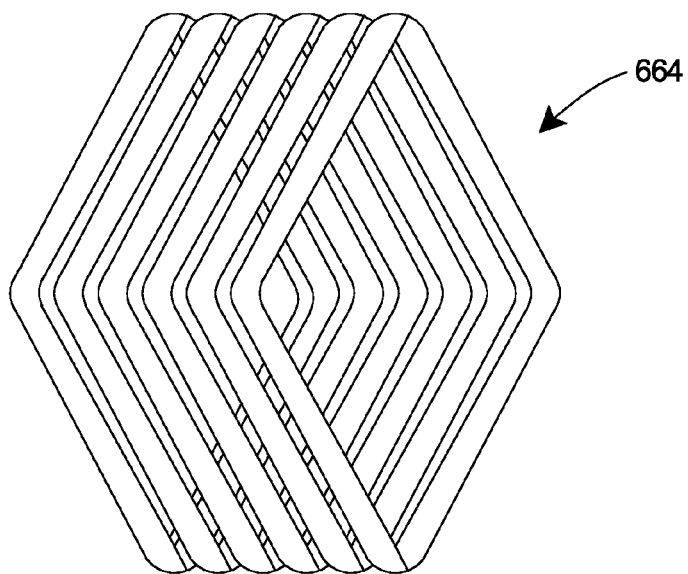
FIG. 6 is a perspective view of a portion of yet another embodiment of a conductor array usable with the present invention.

Further, FIG. 6 is a side view of a portion of yet another embodiment of a conductor array usable with the present invention. More specifically, FIG. 6 is a perspective view of a conductor array including a plurality of diamond shaped conductors 664 that can be used in the mover 344 or the mover 444 described above. For example, if the conductors 664 are used in one of the movers 344, 444, the conductors 664 will need to have a split coil design. A more complete description of the overlapping conductors 664 illustrated in FIG. 6 is provided in U.S. Pat. No. 6,373,153. As far as permitted, the contents of U.S. Pat. No. 6,373,153 are incorporated herein by reference.

Figure 7A:
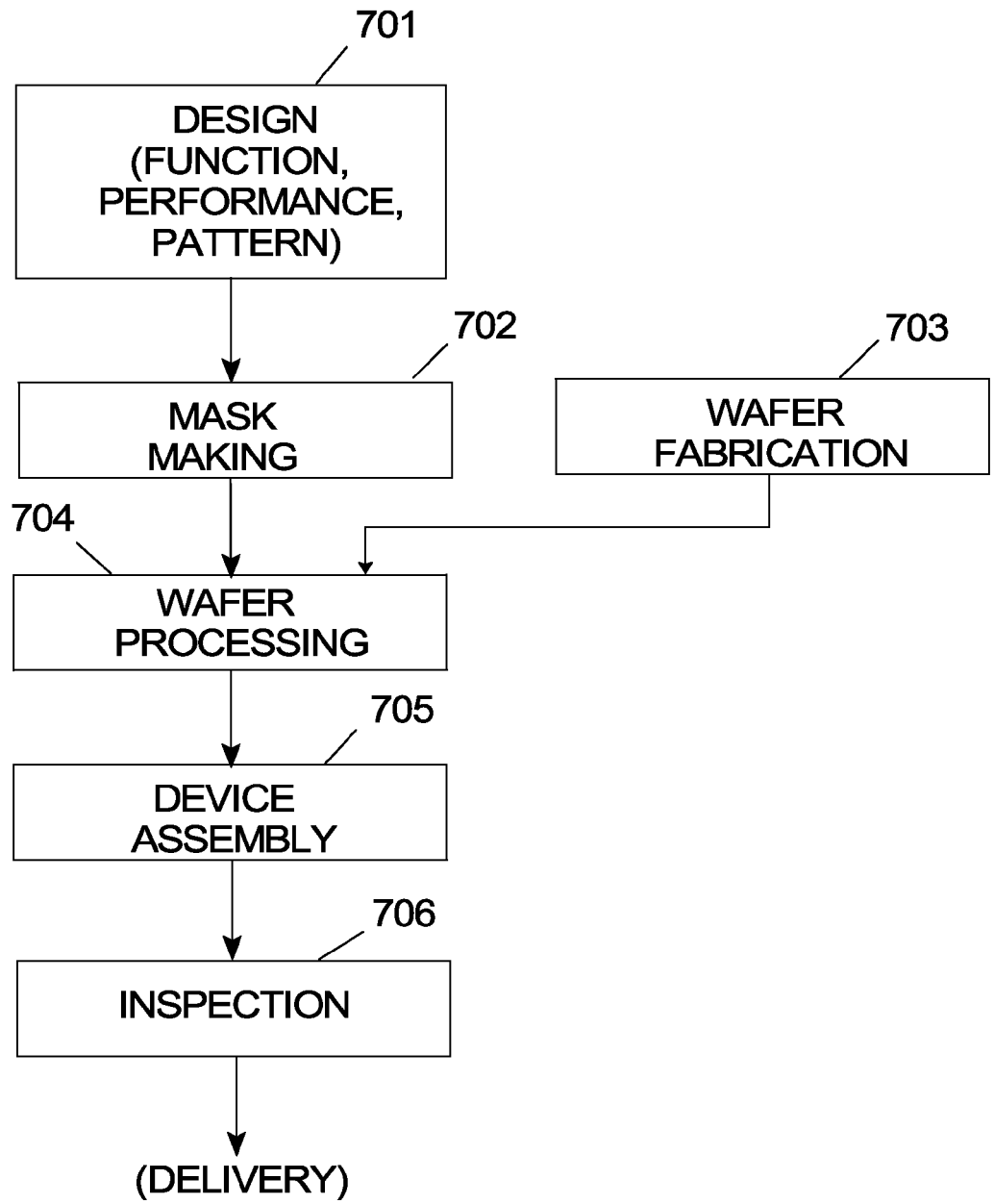
FIG. 7A is a flow chart that outlines a process for manufacturing a device in accordance with the present invention.

Semiconductor devices can be fabricated using the above described systems, by the process shown generally in FIG. 7A. In step 701 the device's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the present invention. In step 705, the semiconductor device is assembled (including the dicing process, bonding process and packaging process), finally, the device is then inspected in step 706.

Figure 7B:
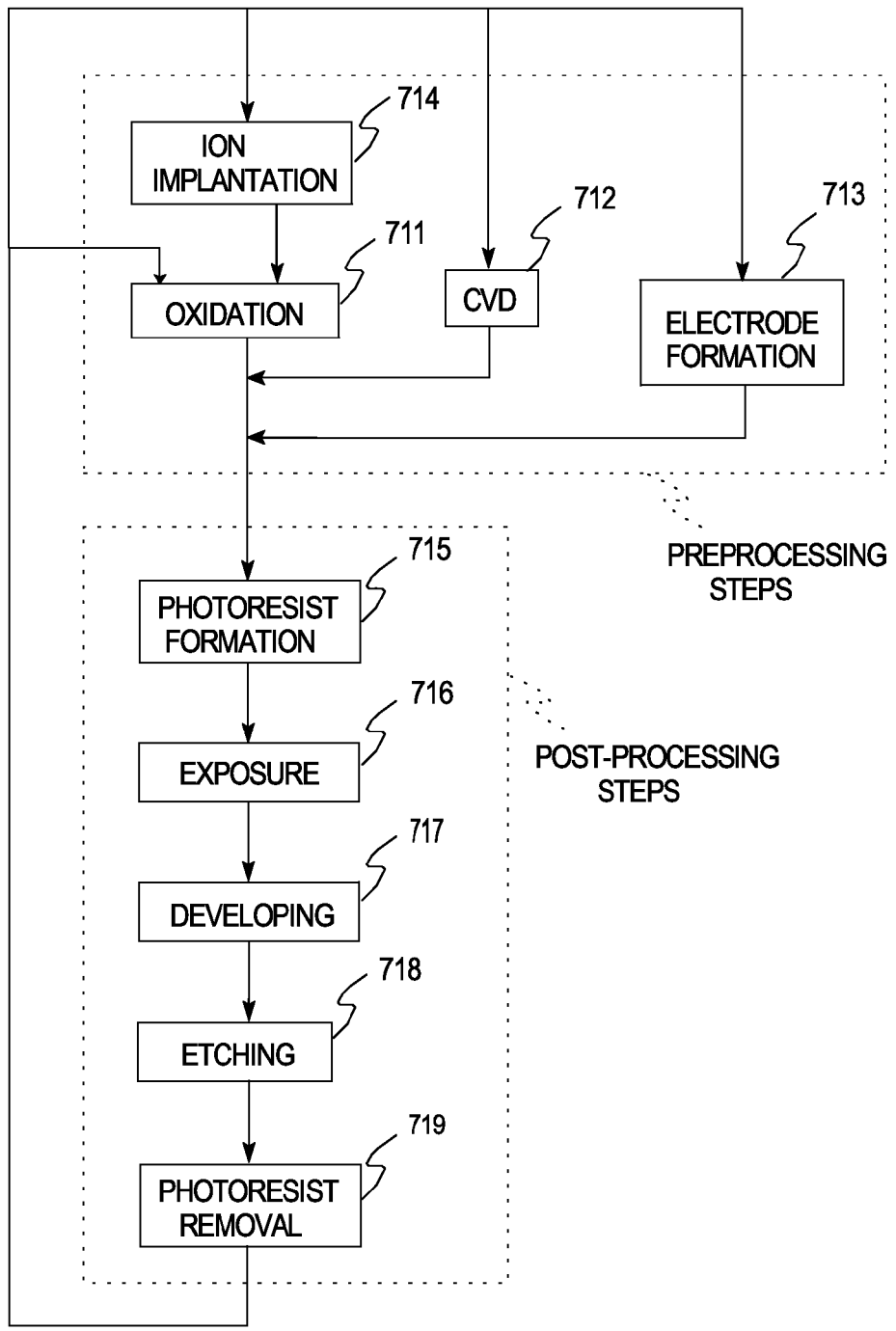
FIG. 7B is a flow chart that outlines device processing in more detail.

FIG. 7B illustrates a detailed flowchart example of the above-mentioned step 704 in the case of fabricating semiconductor devices. In FIG. 7B, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above mentioned steps 711-714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then in step 717 (developing step), the exposed wafer is developed, and in step 718 (etching step), parts other than residual photoresist (exposed material surface) are removed by etching. In step 718 (photoresist removal step), unnecessary photoresist remaining after etching is removed. Multiple circuit patterns are formed by repetition of these preprocessing and post-processing steps.

It is to be understood that movers disclosed herein are merely illustrative of the presently preferred embodiments of the invention and that no limitations are intended to the details of construction or design herein shown other than as described in the appended claims.

What is claimed is:

1. An actuator for applying independently controlled forces to a stage along a first axis, along a second axis that is perpendicular to the first axis, and along a third axis that is perpendicular to the first axis and the second axis, the actuator comprising:
   a magnetic component including a plurality of magnets arranged in a first magnet array along the first axis and a second magnet array along the first axis that produce a magnetic field, the first magnet array and the second magnet array being spaced apart along the second axis to define a magnet gap;
   a conductor component that is positioned near the magnetic component in the magnetic field and in the magnet gap, the conductor component interacting with the first magnet array and the second magnet array when current is directed to the conductor component; wherein the conductor component and the magnetic component are displaced relative to each other along the third axis; wherein the conductor component includes a first endturn and a second endturn, and wherein different percentages of the first endturn and the second endturn lie within the magnetic field of the magnetic component at all times during the movement of the stage along the first axis, along the second axis and along the third axis; and
   a control system that directs current to the conductor component to generate a controllable force along the first axis, a controllable force along the second axis, and a controllable force along the third axis.

2. The actuator of claim 1 wherein the conductor component includes a split coil design.

3. The actuator of claim 2 wherein the conductor component includes a first conductor array and a second conductor array that is positioned substantially adjacent to the first conductor array.

4. The actuator of claim 3 wherein the control system independently directs current to each of the conductor arrays to generate a controllable force along the first axis, along the second axis, and along the third axis.

5. The actuator of claim 3 wherein the first conductor array is shifted along the first axis relative to the second conductor array.

6. The actuator of claim 5 wherein the control system independently directs current to the first conductor array and the second conductor array to generate a controllable moment about the third axis.

7. The actuator of claim 1 wherein the conductor component includes a plurality of coils, and wherein the control system independently directs current to each of the plurality of coils.

8. A stage assembly that moves a device, the stage assembly including a stage that retains the device and the actuator of claim 1 that applies forces to the stage along the first axis.

9. An exposure apparatus including an illumination system and the stage assembly of claim 8 that moves the device relative to the illumination system.

10. A process for manufacturing a device that includes the steps of providing a substrate and forming an image to the substrate with the exposure apparatus of claim 9.

11. An actuator for applying independently controlled forces to a stage along a first axis, along a second axis that is perpendicular to the first axis, and along a third axis that is perpendicular to the first axis and the second axis, the actuator comprising:
   a magnetic component including a plurality of magnets arranged in a first linear magnet array along the first axis that produce a magnetic field;
   a conductor component that is positioned near the magnetic component in the magnetic field, the conductor component interacting with the magnetic component when current is directed to the conductor component, the conductor component including a first linear conductor array and a second linear conductor array, wherein each conductor array includes a plurality of conductors that are aligned along the first axis, wherein the conductor component and the magnetic component are displaced relative to each other along the third axis; wherein the conductor component includes a first endturn and a second endturn; and wherein different percentages of the first endturn and the second endturn lie within the magnetic field of the magnetic component at all times during the movement of the stage along the first axis, along the second axis and along the third axis; and
   a control system that independently directs current to the first linear conductor array and the second linear conductor array so that the linear conductor arrays interact with the first linear magnet array to generate a controllable force along the first axis, a controllable force along the second axis, and a controllable force along the third axis.

12. The actuator of claim 11 wherein the second conductor array is positioned substantially adjacent to the first conductor array, wherein the first conductor array is shifted along the first axis relative to the second conductor array, and wherein the control system directs current to the first conductor array and the second conductor array to generate a controllable moment about the third axis.

13. The actuator of claim 11 wherein the magnetic component further includes a second linear magnet array that is arranged along the first axis such that the first linear magnet array and the second linear magnet array are positioned on opposite sides of the conductor component.

14. A stage assembly that moves a device, the stage assembly including a stage that retains the device and the actuator of claim 11 that applies forces to the stage along the first axis.

15. An exposure apparatus including an illumination system and the stage assembly of claim 14 that moves the device relative to the illumination system.

16. A process for manufacturing a device that includes the steps of providing a substrate and forming an image to the substrate with the exposure apparatus of claim 15.

17. A method for applying independently controlled forces to a device along a first axis, along a second axis that is perpendicular to the first axis, and along a third axis that is perpendicular to the first axis and the second axis, the method comprising the steps of:
   coupling the device to a stage;
   providing a magnetic component having a plurality of magnets arranged in a first magnet array along the first axis and a second magnet array along the first axis that produce a magnetic field, the first magnet array and the second magnet array being spaced apart along the second axis to define a magnet gap;
   providing a conductor component that is positioned near the magnetic component in the magnetic field and in the magnet gap, the conductor component having a first endturn and a second endturn;
   displacing the conductor component and the magnetic component relative to each other along the third axis so that different percentages of the first endturn and the second endturn lie within the magnetic field of the magnetic component at all times during the movement of the stage along the first axis, along the second axis and along the third axis;

coupling one of the components to the stage; and directing current to the conductor component so that the conductor component interacts with the first magnet array and the second magnet array to generate a controllable force along the first axis, a controllable force along the second axis that is perpendicular to the first axis, and a controllable force along the third axis that is perpendicular to the first axis and the second axis.

18. The method of claim 17 wherein the step of providing a conductor component includes the conductor component having a split coil design.

19. The method of claim 18 wherein the step of providing a conductor component includes providing a first conductor array and a second conductor array that is positioned substantially adjacent to the first conductor array, and wherein the step of directing includes the step of independently directing current to the first conductor array and the second conductor array to generate a controllable force along the first axis and along the second axis.

20. The method of claim 19 wherein the step of providing a first conductor array includes the first conductor array being shifted along the first axis relative to the second conductor array, and wherein the step of directing includes directing current to the first conductor array and the second conductor array to generate a controllable moment about the third axis.

21. A method for making an exposure apparatus comprising the steps of providing an illumination source, providing a device, and applying forces to the device by the method of claim 17.

22. A method of making a wafer including the steps of providing a substrate and forming an image on the substrate with the exposure apparatus made by the method of claim 21.

23. An actuator for applying independently controlled forces to a stage along a first axis, along a second axis that is perpendicular to the first axis, and along a third axis that is perpendicular to the first axis and the second axis, the actuator comprising:

a magnetic component including a plurality of magnets arranged in an array along the first axis that produce a magnetic field;

a conductor component that is positioned near the magnetic component in the magnetic field, the conductor component interacting with the magnetic component when current is directed to the conductor component, the conductor component and the magnetic component being displaced relative to each other along the third axis, and the conductor component including a first endturn and a second endturn, wherein different percentages of the first endturn and the second endturn lie within the magnetic field of the magnetic component at all times during the movement of the stage along the first axis, along the second axis and along the third axis; and a control system that directs current to the conductor component to generate a controllable force along the first axis, a controllable force along the second axis, and a controllable force along the third axis.

24. The actuator of claim 23 wherein the conductor component includes a split coil design.

25. The actuator of claim 24 wherein the conductor component includes a first conductor array and a second conductor array that is positioned substantially adjacent to the first conductor array, the first conductor array being shifted along the first axis relative to the second conductor array.

26. The actuator of claim 25 wherein the control system independently directs current to the first conductor array and the second conductor array to generate a controllable moment about the third axis.

27. A stage assembly that moves a device, the stage assembly including a stage that retains the device and the actuator of claim 23 that applies forces to the stage along the first axis.

28. An exposure apparatus including an illumination system and the stage assembly of claim 23 that moves the device relative to the illumination system.

29. A process for manufacturing a device that includes the steps of providing a substrate and forming an image to the substrate with the exposure apparatus of claim 28.

30. The actuator of claim 25 wherein the magnetic component includes a first magnet array arranged along the first axis and a second magnet array arranged along the first axis, the first magnet array and the second magnet array being spaced apart along the second axis to define a magnet gap; and wherein the conductor component is positioned in the magnet gap, the conductor component interacting with the first magnet array and the second magnet array when current is directed to the conductor component.

* * * * *